United States Patent [19]
Fiedler

[11] Patent Number: 5,211,324
[45] Date of Patent: May 18, 1993

[54] COMPOSITE BOAT TRANSPORT PROVIDING CLIPLESS SECUREMENT OF SEMICONDUCTOR DEVICE ASSEMBLY TO BOAT TRANSPORT, AND OF LID TO PACKAGE BODY

[75] Inventor: Wallace A. Fiedler, San Jose, Calif.

[73] Assignee: LSI Logic Corporation, Milpitas, Calif.

[21] Appl. No.: 933,450

[22] Filed: Aug. 21, 1992

[51] Int. Cl.⁵ .............................................. B23K 3/00
[52] U.S. Cl. ................................... 228/44.3; 228/47; 228/212; 269/8
[58] Field of Search ..................... 228/180.2, 212, 254, 228/44.3, 44.7, 47; 269/8, 903

[56] References Cited

U.S. PATENT DOCUMENTS

| | | | |
|---|---|---|---|
| 4,489,923 | 12/1984 | Barresi et al. | 228/254 |
| 4,558,812 | 12/1985 | Bailey et al. | 228/254 |
| 4,859,498 | 8/1989 | Yamaguchi | 269/8 |
| 5,103,367 | 4/1992 | Horwitz et al. | 269/8 |

Primary Examiner—Samuel M. Heinrich
Attorney, Agent, or Firm—Gerald E. Linden; Michael D. Rostoker

[57] ABSTRACT

A magnet is disposed in proximity to an un-lidded semiconductor package being assembled. When a ferrous lid is placed over the package opening, the magnetic field holds the lid in place, and also holds the package on an assembly boat carrying the package through an oven for hermetic sealing.

5 Claims, 3 Drawing Sheets

COMPOSITE BOAT TRANSPORT PROVIDING CLIPLESS SECUREMENT OF SEMICONDUCTOR DEVICE ASSEMBLY TO BOAT TRANSPORT, AND OF LID TO PACKAGE BODY

TECHNICAL FIELD OF THE INVENTION

The invention relates to the assembly of semiconductor devices in a package, and particularly to steps in package assembly where the semiconductor device is sealed within a ceramic body having pins and transported through an oven for further processing.

BACKGROUND OF THE INVENTION

As used herein, a "semiconductor device" is a silicon chip (die) containing circuit elements on a face thereof, and a "semiconductor device assembly" is a silicon chip contained within a package and connected (wired or bonded) to conductive leads which exit the package body.

A common type of semiconductor device assembly has a plurality of pins exiting the bottom surface of the package body, and is termed a Pin Grid Array (PGA). Another common type of semiconductor device assembly has a plurality of leads exiting the package body, and is referred to as a "leaded carrier". Pins are discussed in the main, hereinafter. Irrespective of whether the package is provided with pins or leads, ceramic is a common material for forming the package body. U.S. Pat. No. 4,972,253 discloses a ceramic package encapsulating an integrated circuit (IC) chip.

In the process of packaging a semiconductor device, it is typical that the semiconductor die is inserted into an opening in the package body. The package already has pins (or leads) exiting the package body, and lead fingers within the package body. The lead fingers are electrically connected to the pins. After the semiconductor device is connected to the lead fingers (such as by wire or tape-automated bonding), a lid is applied over the package opening to seal the device within the package.

As illustrated in the aforementioned U.S. Pat. No. 4,972,253, a ceramic package (11) has a cavity (opening, 21) for receiving an integrated circuit chip (semiconductor device, 22). The chip (die, 22) is mounted within the cavity (21) with electric solder or other means (48). Bond areas (bond sites, 32) are disposed about die (22), within the cavity (21), and the die (22) is connected with bond wires (33) to the bond areas (32). The cavity (21) is then closed with a cover (lid, 23). The cover (23) attaches to the package (11) via a plated metal seal ring (31) on a surface of the package around the opening. Any suitable means may be used to secure the die in place.

FIG. 1 shows a typical semiconductor device assembly 100, being fabricated. The assembly includes a square, flat ceramic package body 102 having a top surface 102a and a bottom surface 102b. An opening 104 extends into the top surface of the package. A plurality of pins 106 extend outward from the bottom surface 102b, and are connected (not shown) to lead fingers (bond sites) 108 which extend to within the opening. This type of package is referred to as a Pin Grid Array (PGA).

A semiconductor die 108 is inserted into the opening 104, is attached (adhered) to a die attach area, and is connected to the exposed ends of the lead fingers 108 by any suitable technique (e.g., wire bonding or tape automated bonding).

In many cases, selected pins, for example one pin at each of the four corners of the package 102, are provided with expanded "stops" 106a spaced from the bottom 102b of the package body 102, so that the package body 102 will sit a prescribed distance above a printed wiring board to which the assembly 100 is mounted. A central area (not visible in the view of FIG. 1) on the bottom surface 102b of the package 102 may ("partially-populated") or may not be ("fully-populated") free of pins, in an area corresponding roughly to the opening 104. In the case of a leaded (versus pins) package, virtually the entire bottom surface 102b of the package body is flat (nothing protruding therefrom).

The top surface 102a of the package is has a metallic ring 110 formed about the periphery of the opening 104. After the semiconductor device 114 is attached to the lead fingers 108, a lid 116 is secured over the opening 104, "capping" the package. The lid is essentially a flat metal plate, and is evidently slightly larger than the opening 104. The lid is commonly sized to fit over the ring 110. A solder "preform" foil 118, of similar size and shape as the ring 110 is provided between the lid 116 and the ring 110, so that the lid may be secured to the package body 102 simply by heating the entire assembly, causing the preform 118 to seal and secure the lid 116 to the top surface of the package 102, over the opening 104

As mentioned above, in the process of mounting the die in the package, and capping the package, the entire assembly may be passed through an oven (i.e., to melt the preform 118, inter alia). Conveyor transports are common, and the packages are typically placed on "boats" for the journey through the oven.

FIG. 1 shows a portion of a boat 150, positioned to receive the semiconductor device assembly 100. The boat 150 is typically an elongated metal structure capable of supporting and transporting a number (e.g., six) of semiconductor device assemblies 100. The boat 150 is a rigid metal structure having a platform portion 120, a top surface 120a, a bottom surface 120b and an area designated by dashed line 122 for supporting the semiconductor device assembly 100. The boat is provided with side (leg) portions 124 extending downward from opposite side edges of the platform portion 120, so that the top surface 120a is maintained a suitable distance above a conveyor belt (not shown in FIG. 1).

A number of holes 126 are provided through the platform portion 120, and the holes 126 are sized and spaced to allow the pins 106 to pass easily through the top surface 120a so that the package 102 rests directly on its bottom surface 102b, or a prescribed distance above the top surface 120a by virtue of the stops 106a being larger than the holes 126.

Typically, the holes 126 are quite (about 0.020 inches) larger than the diameter of the pins 106, to allow easy insertion of the pins and to prevent gouging or scraping of the pin plating. This evidently allows the package 102 to move, and allows the pins to contact the platform 120. Some of the holes 126 may be only a slightly (e.g., 0.005 inches) larger than the pins 106, and these particular holes "126a" act as guide holes, for a select number of pins 106, such as the guide pins (those pins with stops 106a).

Evidently, the holes 126 are capable of gouging the typically softer plating material on the pins 106, due to burrs and the like. This problem is exacerbated by the smaller guide holes 126a. Further, there are expansion problems when the assembly 100 is transported through an oven on the boat 150, in that the plate portion 120 can contact the pins 106.

In cases where stops 106a are not provided, the package body 102 rests directly atop the platform portion, which can cause damage to brazing 106b (see FIG. 3) at the junction of the pin 106 and the package body 102.

As shown in FIG. 1, a large cutout 130 extends through the plate portion 120 in a region essentially central to the area 122. This cutout 130 allows automated machinery (not shown) to lift the finished semiconductor device assembly 100 up off of the boat 150 at the completion of fabrication (packaging). As mentioned above, a central area on the bottom surface 102b of the package body may be typically free of pins or leads.

As shown in FIG. 1, additional cutouts 132 may be provided within the periphery of the area 122, to minimize the number of holes 126. Only relatively few holes 126, compared with the total number of leads 106, are needed.

Taking into account the cutout 130 and additional cutouts 132, the plate portion 120 is left with "bridges" 134 at two opposite sides of the area 122, and the bridges have a sufficient number of holes 126 to properly align and maintain reasonably motionless a semiconductor device assembly 100.

In the process of inserting the leads 106 of the assembly 100 into the holes 126, because the boat is the direct support for the semiconductor device assembly, contact between the leads and the boat may occur. At the points of contact, any motion of the semiconductor device assembly on the boat has been observed to cause the pin plating to be worn or scratched away, exposing either the under coat or the base metal.

In order to hold the semiconductor device assembly (110) firmly upon the platform portion 120a, and in order to hold the lid 116 firmly in place against the package body 102 (with preform 118 in place), it is known to use mechanical clips of one kind or another.

FIG. 2 shows the semiconductor device assembly 100 supported on the boat 150. A spring clip 200 holds the semiconductor device assembly 110 firmly upon the platform portion 120a, and also holds the lid 116 firmly in place against the package body 102. For purposes of this illustration, pins 106, ring 104 and preform 118 are omitted. Also, the die 114 and bond sites 108 are omitted. The lid 116 is shown covering the opening 104.

The clip 200 (shown greatly stylized for illustrative purposes), includes two opposing arms 202 and 204 capable of exerting a clamping force "F" downward upon the lid 116, to hold the lid against the package body and to hold the package body against the boat 150.

Among other things, it is evident from FIG. 2 that the spring clamp 200:

takes up space, necessitating an oven with a wider mouth;

exerts a slightly skewed force (F) upon the lid, which may cause it to shift with respect to the package body;

exerts a slightly skewed force (F) upon the package body, which may cause the pins (106, FIG. 1) to scrape against the pin-receiving holes (126, FIG. 1); and causes the boat to rest non-level upon the conveyor belt.

Further, since the spring clamps require at least moderate exertion to open, an operator can easily experience fatigue when mounting a large number of semiconductor device assemblies to boats with spring clamps. This can lead to manufacturing snafus.

The "footprint", or contact area of the arm 202 against the lid 116 is typically about ½ the surface area of the lid.

FIG. 3 illustrates another problem with the use of spring clamps, or the like, which exert a force (F) downward on the lid 116. Although the phenomenon is exaggerated in this view, it is evident that a force (F) acting on the lid 116 will cause the lid to "bow", inward towards the opening 104. This causes two related problems. The first is a large gap 302 about the outer periphery of the ring 110, which may be difficult for the solder preform 118 (not shown) to fill and seal. This problem is even more evident at the corners of the lid. The second problem is contact between the lid 116 and the inner periphery of the ring 110, which will prevent solder (118) from effecting a seal. (In the view of FIG. 3, the solder preform 118, die 114 and other elements are omitted for clarity.) these problems will affect the ability of the lid to form a hermetic seal, and subsequent testing (hermetic, x-ray, etc.) will reveal the defects, causing the parts to be scrapped. (In some cases, defective lid seals can be re-done.)

Evidently, it is undesirable to distort the lid 116 in any manner during assembly of the package, as this may result in defective parts, a problem which is especially annoying at such a late stage in the overall fabrication process.

Other, more subtle problems with the use of spring clips, or the like, is that they clamp the package too firmly to the boat platform. Unequal expansion coefficients of the metallic boat platform and the ceramic package material can cause damage to the pins or leads of the package. Also, in removing spring clips, the operator may inadvertently allow the spring clip to "drag" across the pins or leads, creating damage that must then be repaired or rejected. Worse yet, a fatigued operator may inadvertently allow the spring clip to drag across the wire bonds connecting the die to the lead fingers, or across the die itself, both of which situations are extremely undesirable.

What is needed is an effective technique for holding a lid in place upon a package body, and an effective technique for holding a package body securely to a boat.

DISCLOSURE OF THE INVENTION

It is an object of the present invention to provide an improved technique for handling semiconductor device assemblies during steps involving placing a lid on a package body and securely supporting the package on a boat transport.

It is another object of the present invention to provide a technique for preventing motion of a semiconductor device assembly relative to a boat.

It is another object of the present invention to provide a technique for holding a lid against a package body, without distorting the lid.

According to the invention, a magnet is disposed adjacent a boat platform to exert a magnetic force holding a metallic lid over an opening in a semiconductor package, and to hold the package on the boat platform, thereby eliminating the need for spring-type clips to perform these functions.

According to an aspect of the invention, the magnet is mounted to a "loader" supporting the boat transport, so that the magnet is directly underneath the semiconductor package. A typical sequence of operations is (1) placing the un-lidded package onto the boat platform, installing and wiring the die, placing the boat onto the loader, positioning the lid (the solder preform is usually bonded to the inner surface of the lid), and transporting everything through an oven.

Using magnets ensures accurate positioning of the metallic lid and controlled solder displacement.

Another advantage of using magnets is that spring clips will protrude from the boat, in one direction or another, and can become snagged on the curtains covering the oven mouths.

Other objects, features and advantages of the invention will become apparent in light of the following description thereof.

DETAILED DESCRIPTION OF THE INVENTION

Figure 1:
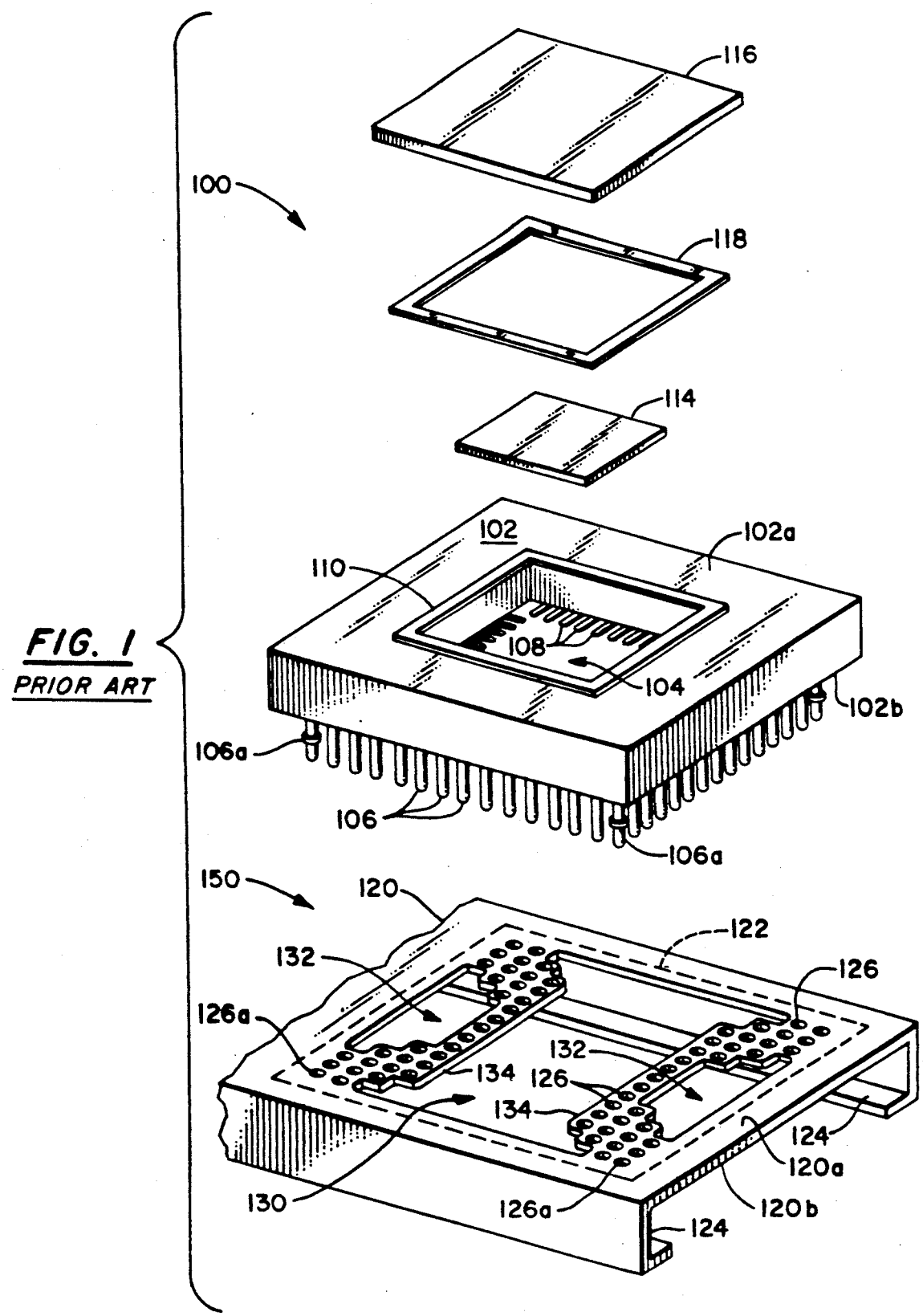
FIG. 1 is an exploded perspective view of a semiconductor device assembly 100 and boat transport 150 of the prior art, and is discussed hereinabove.

FIG. 1 shows a semiconductor device assembly 100 and a boat 120, and has been discussed above.

Figure 2:
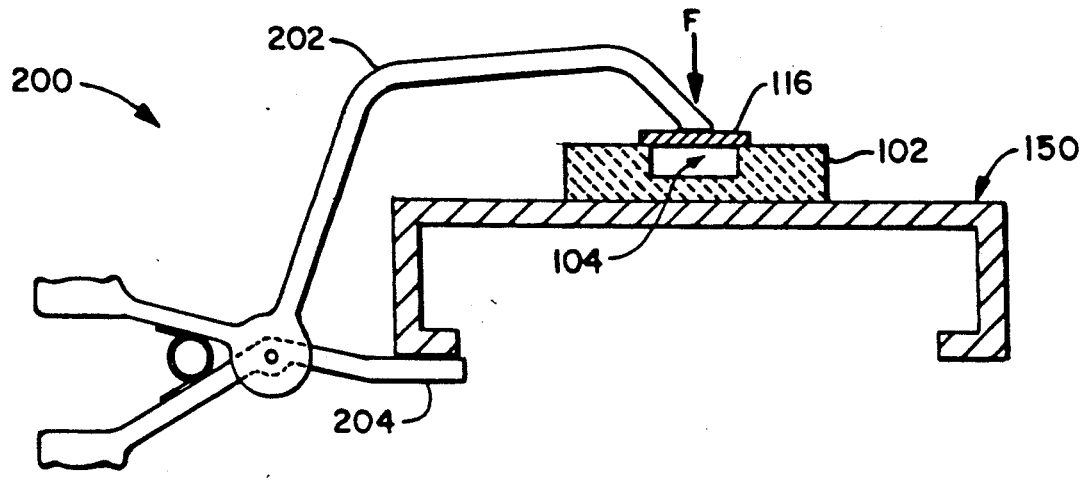
FIG. 2 is a cross-sectional view of the assembly 100 of FIG. 1 on the boat 150 of FIG. 1, including a view of a prior art spring clamp 200, and is discussed hereinabove.

FIG. 2 shows a semiconductor device assembly 100 mounted with a spring clamp 200 to a boat 150, and has been discussed above.

Figure 3:
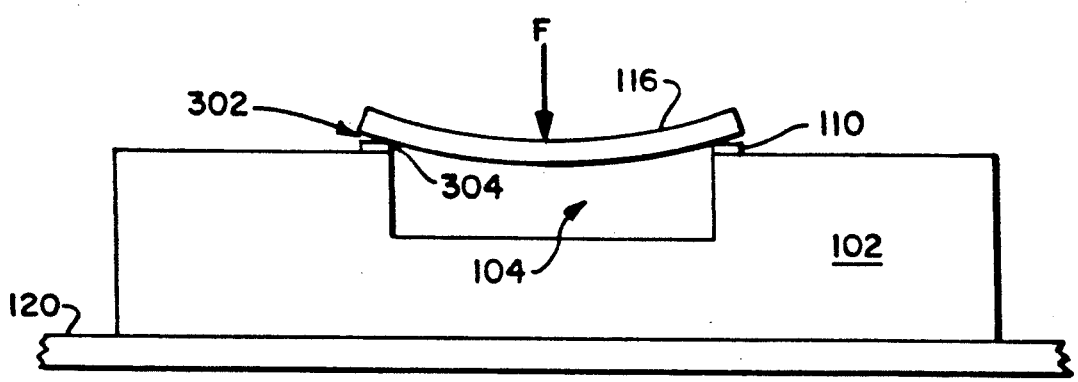
FIG. 3 is a schematic representation detailing how the force F exerted by the spring clamp 200 of FIG. 2 distorts a lid 116 being applied to a package 102, and relates essentially to the prior art of FIG. 2.

FIG. 3 shows how a spring clamp 200, or other mechanical means exerting a force directly on the lid 116 distorts the lid and causes sealing problems.

The present invention relates primarily to providing a technique for effectively holding the lid 116 in place on the package body 102 during assembly, and for effectively holding the package body 102 on a boat transport 150 during assembly.

Figure 4:
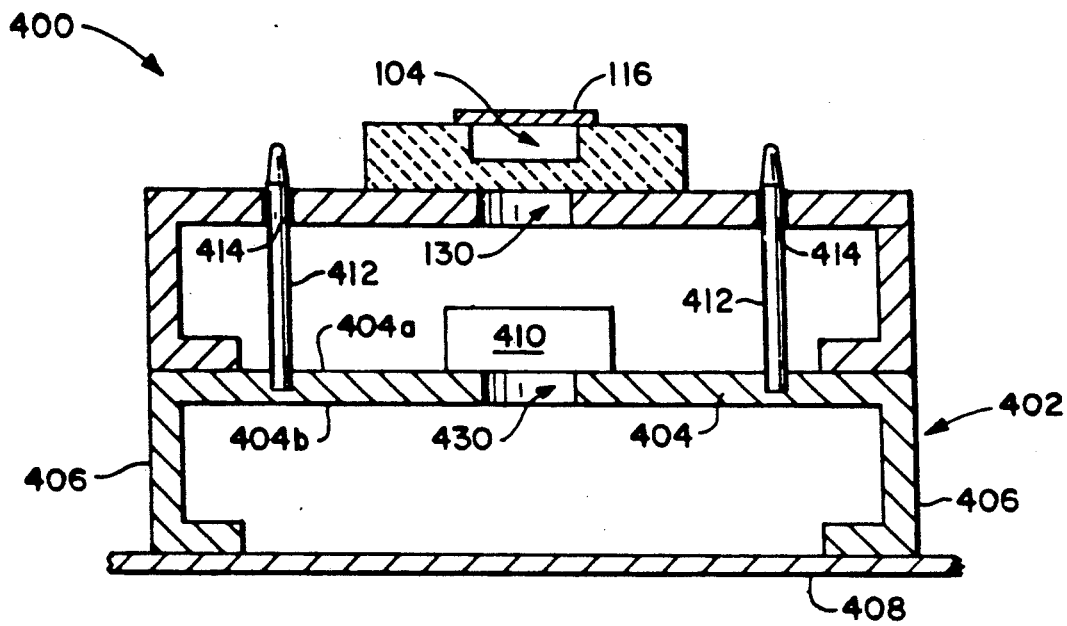
FIG. 4 is a cross-sectional view of the composite boat transport of the present invention.

FIG. 4 shows the "composite" boat transport 400 of the present invention. To begin with, typical materials for the lid 116 are Kovar (an alloy of cobalt, nickel and iron), or Alloy 42 (an alloy of nickel and iron), both of which are ferrous materials. The lid is commonly gold plated.

The composite boat transport 400 includes any suitable prior art boat, such as the boat 150 of FIG. 1. Such a boat is typically formed of stainless steel. The composite boat transport 400 further includes an underlying support structure 402, or "loader", which may also be formed of stainless steel.

The loader 402 includes a platform portion 404 having a top surface 404a and a bottom surface 404b, and includes legs 406 extending from opposite side edges of the platform portion 404. As is readily seen from the view of FIG. 4, the loader 402 resembles in many respects the boat 150. In fact, a suitable loader can be made simply by modifying a standard boat.

The loader 402 is suitable sized and shaped to provide an underlying support for the boat 150, and to support the composite assembly 400 on a conveyor belt 408. Typical conveyor belts are usually formed of stainless steel link mesh.

A magnet 410 is mounted by any suitable means, such as adhesives or fasteners (not shown), to the top surface 404a of the loader 402, at a position corresponding to the ultimate location of a semiconductor package 102 resting on the boat 150. For example, the magnet 410 can be located directly underneath the package 102 (i.e., directly underneath the opening 130 in the boat 150; see FIG. 1). Or it can be slightly offset.

The magnet 410 is preferably disposed to be as close as possible to the package 102. In the case of a "fully-populated" pin grid array package, an allowance must evidently be made for the pins. A suitable package/magnet spacing will depend on such factors as pin length, magnet strength, etc.

The magnet 410 is suitably a solid round or square magnet, formed of Alnico (aluminum, nickel, iron) or other suitable material that provides a strong magnetic field and that can withstand repeated temperature cycles up to about 350° C., which is a common temperature for effecting fusing of the lid 116 to the ring 110.

To assist in locating the boat 150 vis-a-vis the loader 402, the loader 402 is provided with locating pins 412 extending upward from the top surface 404a sufficiently to extend through corresponding holes 414 in the boat 150. These holes 414 may already exist in the boat 150, or may be provided therein according to the present invention.

The magnet 410 is of sufficient strength to exert an attractive force upon the lid 116 which will hold the lid 116 sufficiently firmly against the package body 102, while allowing the lid 116 to be easily repositioned by a technician. And, the magnetic field should be of sufficient strength to hold the package body 102 (by virtue of the downward force on the lid) against the boat 150. (The boat and loader both being non-ferrous stainless steel, the magnet will not attract the boat.) Again, the field strength should be selected to allow for easy separation of the boat from the loader. For any particular application, magnets of appropriate strength can easily be selected by one skilled in the art to which the present invention most nearly pertains. For typical applications, a magnet rated at 750 gauss should be sufficient.

At the end of the assembly process, when the lid is sealed to the package body, the loader is separated from the boat, and the packages are removed from the boat. Evidently, the magnetic field should not be so strong that separating the loader from the boat will cause the packages to fly all over the assembly room.

As mentioned above, the hole 130 in the boat 150 allows automated equipment to lift the package 102 off of the boat 150. In the event that it is desired to be able to use such equipment to lift the package 102 off of the composite transport 400, the loader 402 can be provided with an opening 430 aligned with the boat opening 130. In this case, the magnet 410 can be ring-shaped, having an opening aligned with the opening 430, or may comprise a magnet slightly offset from the opening, or may comprise two or more magnets surrounding the opening.

Figure 5:
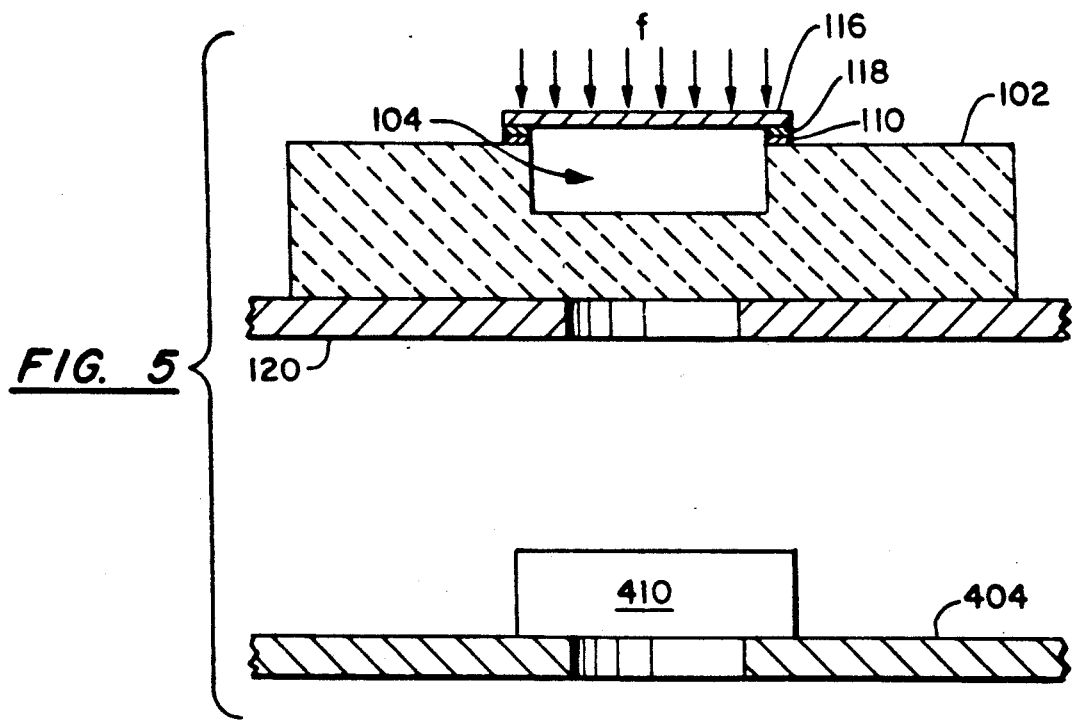
FIG. 5 is a schematic representation detailing how the technique of the present invention does not distort a lid 116 being applied to a package, and relates essentially to the invention shown in FIG. 4.

FIG. 5 illustrates how the invention avoids the lid deformation problem of the prior art (compare FIG. 3).

Herein it can be seen that a magnetic field "f" exerts a generally uniform force on the lid 116, spread out over the entire area of the lid, thereby avoiding voids (304) and thin spots (304) in the solder seal (118).

The composite transport of this invention allows for easy assembly of the lid to the package and of the package to the boat, for subsequent processing steps such as a journey through the oven. At the completion of the processing steps, the loader is easily separated from the boat, and the package is easily removed from the boat. This eliminates the aggravation of dealing with clips, clamps, springs, or the like, of the prior art. Furthermore, a typical spring mechanism used for holding the lid and package is more susceptible to degradation by the heat of the oven than a typical magnet.

The invention results in greater ease of use and greater yield than prior art mechanisms.

One alternative to using a separate loader, per se, is to secure the magnet to the underside (120b) of the boat (150), bearing in mind that a PGA has pins extending through the platform portion. A leaded package does not have pins extending through the platform, and in some instances may accommodate such an arrangement.

In this case, the bottom surface (120b) of the boat (150) would be considered to be the top surface (404a) of the loader (402).

Another alternative, albeit somewhat complex, would be to use electromagnets rather than permanent magnets. This would allow greater control over energizing and de-energizing the field, and could be useful in avoiding jarring the semiconductor device assemblies when separating the loader from the boat.

What is claimed is:

1. Composite boat transport for supporting semiconductor packages during assembly, comprising:
    a planar platform member having a top surface and a support area on the top surface for supporting a semiconductor package body;
    a loader member having a top surface for supporting the planar platform member; and
    a magnet mounted to the loader member at a location where the magnet will exert a force holding a lid onto the semiconductor package body.

2. Composite boat transport according to claim 1, wherein:
    the magnet is of sufficient strength to hold the package body securely on the platform member.

3. Composite boat transport according to claim 1, further comprising:
    pins extending from the top surface of the loader; and
    corresponding holes through the planar platform member.

4. Composite boat transport according to claim 1, wherein:
    the platform member has an opening in the support area allowing automated equipment to lift the package body up off of the platform member;
    the loader member has a corresponding opening in an area aligned with the support area; and
    at least one magnet is disposed about the opening in the loader member.

5. Boat transport for supporting semiconductor packages during assembly, comprising:
    a platform having a top surface and an area for supporting a semiconductor package body; and
    a magnet associated with the platform for exerting a force holding a lid onto the semiconductor package body.

* * * * *